US008229132B2

(12) United States Patent
Akino

(10) Patent No.: US 8,229,132 B2
(45) Date of Patent: Jul. 24, 2012

(54) MICROPHONE APPARATUS

(75) Inventor: Hiroshi Akino, Mashida (JP)

(73) Assignee: Kabushiki Kaisha Audio-Technica, Tokyo (JP)

( * ) Notice: Subject to any disclaimer, the term of this patent is extended or adjusted under 35 U.S.C. 154(b) by 1074 days.

(21) Appl. No.: 11/964,331

(22) Filed: Dec. 26, 2007

(65) Prior Publication Data

US 2008/0212792 A1 Sep. 4, 2008

(30) Foreign Application Priority Data

Dec. 26, 2006 (JP) ................................ 2006-349848

(51) Int. Cl.
*H04R 27/00* (2006.01)
*H03G 3/20* (2006.01)

(52) U.S. Cl. ................. 381/83; 381/85; 381/82; 381/57

(58) Field of Classification Search .............. 381/82-85, 381/57

See application file for complete search history.

(56) References Cited

U.S. PATENT DOCUMENTS

| | | | | |
|---|---|---|---|---|
| 5,119,428 | A * | 6/1992 | Prinssen | 381/83 |
| 5,343,534 | A * | 8/1994 | Dorrough et al. | 381/123 |
| 5,404,397 | A * | 4/1995 | Janse et al. | 379/202.01 |
| 6,473,514 | B1 * | 10/2002 | Bodley et al. | 381/355 |
| 6,751,316 | B1 * | 6/2004 | Gligoric | 379/421 |
| 7,809,145 | B2 * | 10/2010 | Mao | 381/92 |
| 2002/0136416 | A1 * | 9/2002 | Steenhagen | 381/93 |
| 2002/0141601 | A1 * | 10/2002 | Finn et al. | 381/92 |
| 2003/0118205 | A1 * | 6/2003 | Bodley et al. | 381/356 |
| 2005/0254640 | A1 * | 11/2005 | Ohki et al. | 379/406.1 |
| 2006/0165242 | A1 * | 7/2006 | Miki et al. | 381/59 |

FOREIGN PATENT DOCUMENTS

| | | | |
|---|---|---|---|
| JP | 02-182099 | A | 7/1990 |
| JP | 05-014990 | | 1/1993 |
| JP | 06-284493 | A | 10/1994 |
| JP | 3025781 | U | 6/1996 |
| JP | 10-200986 | | 7/1998 |
| JP | 11-331987 | A | 11/1999 |
| JP | 2003-087891 | | 3/2003 |
| JP | 2005-323308 | A | 11/2005 |

OTHER PUBLICATIONS

Office Action issued in Japanese Patent Application No. 2006-349848 dated Nov. 22, 2011.

* cited by examiner

*Primary Examiner* — Kiesha Bryant
*Assistant Examiner* — Dmitriy Yemelyanov
(74) *Attorney, Agent, or Firm* — Sughrue Mion, PLLC

(57) ABSTRACT

A microphone apparatus is obtained capable of preventing howling effectively, while having no time difference between a timing of voice utterance to a microphone and a timing of sound emission from a speaker and having simple and low-cost physical and electrical configurations. There are provided microphone units or microphones disposed at locations with the same acoustic conditions, and switching units disposed corresponding to the microphone units or microphones, respectively, for switching sequentially an audio signal transformed in each of the microphone units or microphones to generate an output signal. The switching units may switch sequentially the audio signal transformed in the microphone unit or microphone at an shorter time interval than a time period from a time point the microphone unit or microphone is turned on to a time point an output thereof grows to reach a maximum level by howling.

14 Claims, 2 Drawing Sheets

MICROPHONE APPARATUS

BACKGROUND OF THE INVENTION

1. Field of the Invention

The present invention relates to a microphone apparatus suitable for a public-address system and the like, and particularly to a microphone apparatus which can prevent howling.

2. Related Background of the Invention

There occurs howling in a public-address system and the like. The howling occurs because a kind of oscillator is constituted by a serial connection of an acoustic system and an electric system, in such a manner that an amplified acoustic wave emitted from a speaker enters into a microphone and transformed into an audio signal in the microphone, and then the audio signal is amplified to be emitted from the speaker as the amplified acoustic wave. When howling occurs, an unpleasant loud sound is emitted from a speaker.

When howling starts to occur, amplitude of diaphragm in a microphone increases from a small one to a large one. At a timing howling likely starts, the howling tends to stop by taking a measure of adjusting an amplifier gain to reduce a loop gain while the amplitude of the diaphragm is still comparatively small. After the amplitude has become large, however, the howling sometimes can not be suppressed even by a considerable reduction of the amplifier gain. This is because the diaphragm of a microphone is in a persistent oscillation. Measures of preventing howling include various kinds of measures in an acoustic system or an electric system as follows.

Measures in an acoustic system include:

1. changing a position or a direction of a microphone;

2. changing directivity of a microphone from a cardioid pattern to a hyper-cardioid pattern, for example; and 3. changing a position or a direction of a speaker.

Measures in en electric system include:

1. changing phase and amplitude of a audio signal; and 2. removing a specific frequency range with a filter.

The above mentioned measures of preventing howling in a acoustic system, however, are stopgap measures and not fundamental measures, and also take a long time to stop howling, since a position or a direction of a microphone and a speaker or directivity of a microphone is changed through a trial and error process in a situation in which howling is caused by various overlapped conditions.

Also, the above mentioned measures of preventing howling in an electric system have problems that a complicated electric circuit configuration is necessary and also a high fidelity sound of an acoustic wave captured by a microphone can not be reproduced by a speaker, since audio signal thereof is processed.

Technologies disclosed by patent references regarding howling prevention include the followings. One of them is an anti-howl back device which receives a sound input into any one of a plurality of microphones, stores an audio signal thereof into an audio memory via a switching circuit, and reads out the audio signal stored in the audio memory to supply it to each speaker via an amplifier after having finished receiving the sound input into the microphone (refer to patent reference 1). That is, a sound input into each microphone is amplified and reproduced in each speaker after the use of microphone is stopped and thereby howling does not occur.

There is proposed a sound processing apparatus for preventing occurrence of a howling phenomenon, including a transforming means collecting a sound from a sound source and transforming the sound into an electric signal to output the signal, a sound generating means generating a sound corresponding to the electric signal output from the transforming means, and a delaying means delaying the electric signal generated by the transforming means and supplying the delayed signal to the sound generating means, before the sound is generated by the sound generating means (refer to patent reference 2).

Also, there is known a sound collecting apparatus configured so as to: make N channels of pseudo-object sound sources as reference signals; add components from dead angle directions formed by a set of N input channels from M sound collecting means; make the N channel pseudo-object sound sources as input signals; operate N adaptive filters; set obtained N adaptive filter coefficient values to N variable filters; process signals from N sound collecting means among the M sound collecting means; and sum up N outputs thereof (patent reference 3). This reference intends to prevent howling by using a plurality of sound collecting means and by adaptively reducing sensitivities thereof to a speaker largely to attenuate a total sensitivity to the speaker.

Patent reference 1: Japanese Unexamined Patent Application Publication No. 10-200986

Patent reference 2: Japanese Unexamined Patent Application Publication No. 5-14990

Patent Application 3: Japanese Unexamined Patent Application Publication No. 2003-87891

SUMMARY OF THE INVENTION

Problems to be Solved by the Invention

The inventions described in the patent references 1 and 2 delay an audio signal transformed in and output from a microphone and then reproduce an amplified sound to output it from a speaker, and thereby have a problem to cause a time difference between a timing of voice utterance to a microphone and a timing of sound emitting from a speaker resulting in providing a speaking person and a listening person with an uncomfortable feeling.

The invention described in the patent reference 3 needs the M sound collecting means, that is, microphones, the N channels pseudo-object sound sources, the N adaptive filters, etc. and has a problem that physical and electrical configurations become large-scale and high-cost.

An object of the present invention is to solve such problems of the past technologies and to provide a microphone apparatus which can prevent howling effectively, while having no time difference between a timing of voice utterance to a microphone and a timing of sound emitting from a speaker and having simple and low-cost physical and electrical configurations.

Means to Solve the Problems

The present invention includes a plurality of microphone units or microphones disposed at locations with the same acoustic conditions and a switching unit disposed corresponding to each of the microphone units or the microphones for switching sequentially an audio signal transformed by each of the microphone units or the microphones to generate an output signal.

Advantages of the Invention

An audio signal is transformed in a microphone unit or microphone selected by a switching unit and amplified in an amplifier, and then an amplified sound is reproduced to be emitted from a speaker. Thereby, even if an output level of the audio signal in the microphone unit or microphone becomes higher, the switching unit can switch the microphone unit or microphone to another one before the output level of the audio signal reaches a level to cause howling, and it is possible to prevent howling effectively and also to reproduce an amplified sound in a speaker without interruption.

The configuration is simple because there may be only a plurality of microphone units or microphones and a switching unit for switching thereof, and it is possible to provide an anti-howl back microphone apparatus with a low-cost.

DESCRIPTION OF THE PREFERRED EMBODIMENTS

Hereinbelow, an embodiment of a microphone apparatus according to the present invention will be described with reference to the drawings.

Figure 1:
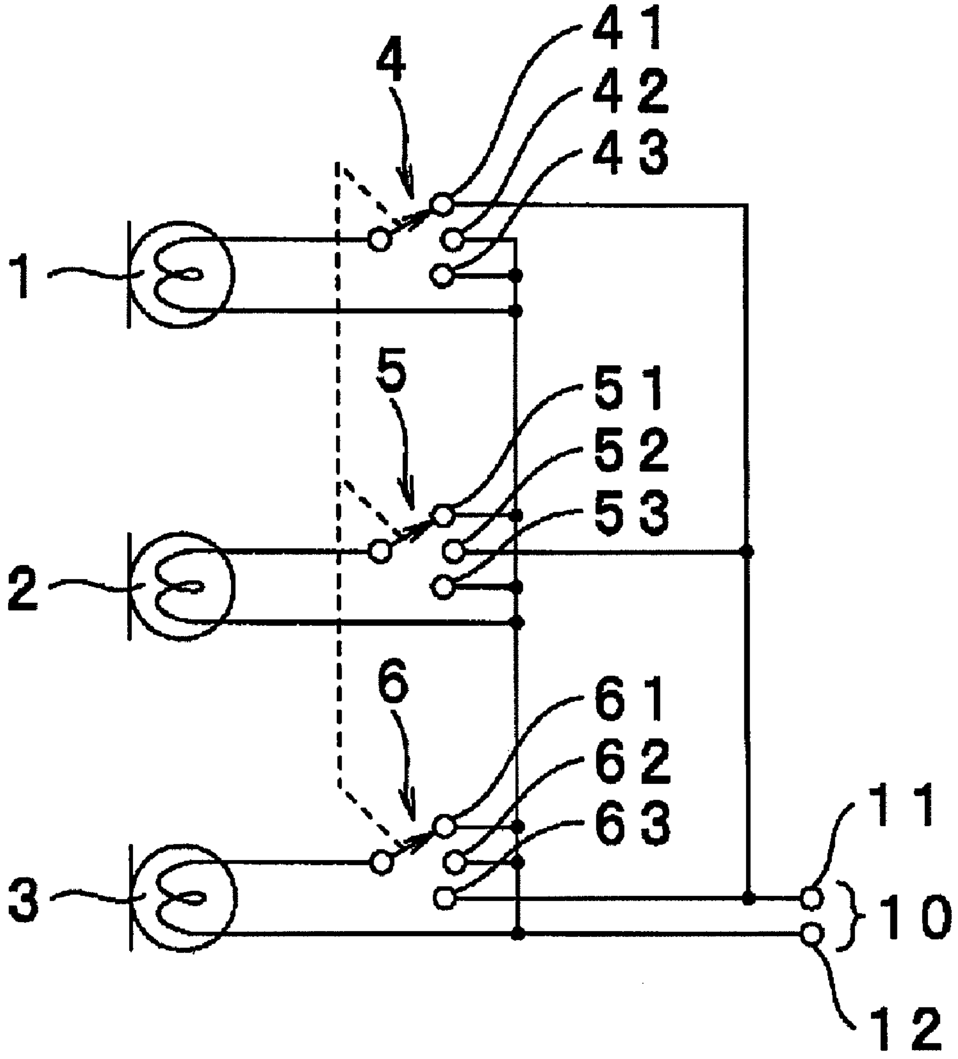
FIG. 1 is a circuit diagram showing an embodiment of a microphone apparatus according to the present invention.

In FIG. 1, reference numerals 1, 2 and 3 denote microphone units respectively. These three microphone units 1, 2 and 3 are disposed at locations with the same acoustic conditions. For example, being incorporated in one microphone case provides the microphone units 1, 2 and 3 with almost the same acoustic conditions.

Each of the above mentioned three microphone units 1, 2 and 3 may be incorporated individually in a microphone case to constitute three microphones. These three microphones are combined in parallel into a piece with a good appearance by use of a kind of suitable holder or binder to be disposed at locations with the same acoustic conditions.

Corresponding to the above mentioned microphone units 1, 2 and 3 or microphones including these microphone units 1, 2 and 3, there are disposed switches 4, 5 and 6 as switching units, respectively. While analog switches, for example, are preferably used for the switching units, mechanical switches will be used in the following description for easy understanding. The three switches 4, 5 and 6 are operated in conjunction with one another and have three switching contacts corresponding to the three microphone units 1, 2 and 3 or microphones.

Each of movable contacts of the three switches 4, 5 and 6 corresponding to the three microphone units 1, 2 and 3 or three microphones is connected with one of output terminals of each of the microphone units 1, 2 and 3 or microphones, respectively. The other output terminals of the microphone units 1, 2 and 3 or microphones are connected in common to one terminal 12 constituting an output line 10. The first switch contact 41 of the switch 4, the second switch contact 52 of the switch 5, and the third switch contact 63 of the switch 6 are connected to the other terminal 11 constituting the output line 10.

The second switch contact 42 and the third switch contact 43 of the switch 4, the first switch contact 51 and the third switch contact 53 of the switch 5, and the first switch contact 61 and the second switch contact 62 of the switch 6 are connected in common to one terminal 12 constituting the output line 10. One of the terminals 11 and 12 constituting the output line 10, for example, the terminal 12, may be made an earth terminal.

In the switches 4, 5 and 6, the movable contacts perform synchronous switching operations repeatedly at a certain time interval sequentially in order of the first contact, second contact, third contact, first contact, . . . , respectively. This switching operation enables an audio signal of the first microphone unit 1 or microphone, an audio signal of the second microphone unit 2 or microphone, and an audio signal of the third microphone unit 3 or microphone to be output sequentially from the output line 10 without interruption. This output signal is amplified in an amplifier (not shown in the drawing) and an amplified sound is reproduced to be emitted from a speaker (not shown in the drawing).

Figure 2:
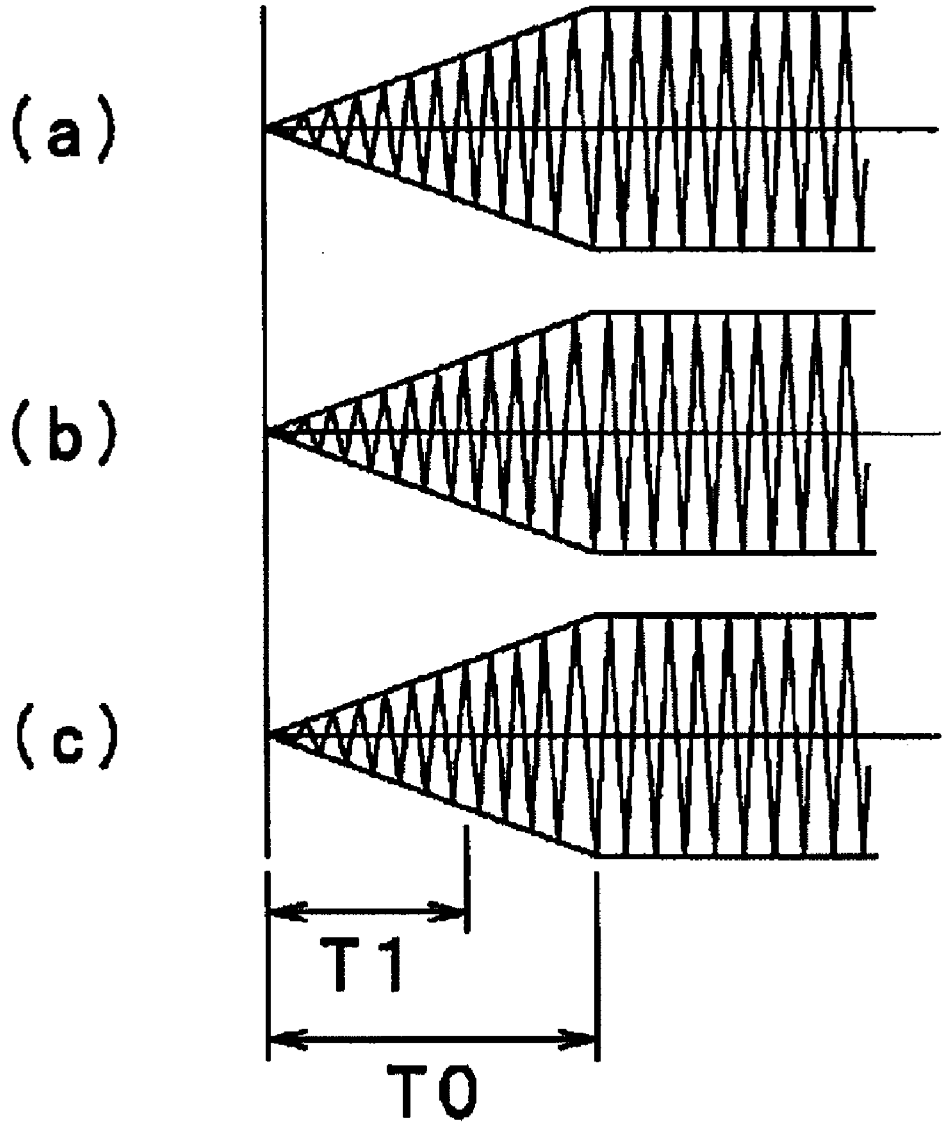
FIG. 2 is a waveform chart showing a state of howling occurrence caused by growth of an output level in each microphone unit or microphone in the embodiment.

FIG. 2 shows a state of output level growths when an acoustic wave emitted from the speaker enters each of the microphone units 1, 2 and 3 and causes howling. In the microphone units 1, 2 and 3, which are disposed at locations with the same acoustic conditions, the output levels grow mutually in the same way. In each of the microphone units 1, 2 and 3, a certain time period T0 elapses from a time point a sound from the speaker enters the microphone unit to a time point howling occurs to saturate the output level. Then, the switching time interval of the switches 4, 5 and 6 is set to be T1 which is shorter than the time period T0. Thereby, before an output level grows to a level of howling occurrence in one of the microphone units, the switches 4, 5 and 6 switch the microphone unit to the next microphone unit resulting in that the sound is emitted from the speaker without interruption and also without howling.

The microphone units 1, 2 and 3 and microphones including them are preferably dynamic-microphone units or dynamic-microphones using these units, each of which generates electric power by vibrating a coil integrated with a diaphragm in a magnetic field according to an input sound. In the dynamic type, the time period T0 from the time point a sound is input from a speaker to the time point howling occurs to saturate an output level is comparatively long to allow the switches 4, 5 and 6 to be switched at a comparatively long time interval.

Also, in the case of dynamic type, the output terminals of the microphone units or microphones except for the microphone unit or microphone selected by the switch may be short-circuited to provide electromagnetic damping to the coils and the diaphragms thereof. This can suppress occurrence of persistent oscillation of the diaphragms and make howling unlikely to occur.

As described hereinabove, it is preferable to use an analog switch for the switching unit. The analog switch can switch quickly the microphone units or microphones without occurrence of a noise by the switching.

While, in the embodiment shown in the drawing, three microphone units or microphones are used, there may be at least two or more, i.e., a plurality of, microphone units or microphones. However, by using more microphone units or microphones, it is possible to output a signal after having suppressed the persistent oscillation of the diaphragms sufficiently and to improve an anti-howling effect.

It is possible to prevent howling without damaging a usual acoustic performance by disposing microphone units or microphones at positions with the same acoustic conditions.

What is claimed is:

1. A microphone apparatus comprising:

a plurality of microphone units disposed at locations with the same acoustic conditions; and a plurality of switching units, each of the switching units connected to a respective microphone unit, each of the switching unit including a switch and a plurality of switching contacts, and each switching contact including a contact to each of the plurality of microphone units for switching sequentially an audio signal transformed in each of the microphone units to generate an output signal, before an output level of the audio signal transformed in each of the microphone units saturates, wherein the switches are moveable contacts for performing synchronous switching operations repeatedly at a certain time interval in order of the switching contacts corresponding to the plurality of microphone units for switching sequentially, and wherein only one switching contact of the switching contacts of each of the switching units is connected to a first output terminal and the other switching contacts of each of the switching units are connected to a second output terminal different from the first output terminal, and wherein the first and second output terminals comprise an output line.

2. A microphone apparatus comprising:

a plurality of microphones disposed at locations with the same acoustic conditions; and a plurality of switching units, each of the switching units connected to a respective microphone, each of the switching units including a switch and a plurality of switching contacts, and each switching contact including a contact to each of the plurality of microphones for switching sequentially an audio signal transformed in each of the microphones to generate an output signal, before an output level of the audio signal transformed in each of the microphones saturates:

wherein the switches are moveable contacts for performing synchronous switching operations repeatedly at a certain time interval in order of the switching contacts corresponding to the plurality of microphone units for switching sequentially, and wherein only one switching contact of the switching contacts of each of the switching units is connected to a first output terminal and the other switching contacts of each of the switching units are connected to a second output terminal different from the output terminal, and wherein the first and second output terminals comprise an output line.

3. The microphone apparatus according to claim 1, wherein the plurality of microphone units is incorporated in one microphone case.

4. The microphone apparatus according to claim 2, wherein the plurality of microphones is combined together in one piece.

5. The microphone apparatus according to claim 1, wherein the switching unit switches the audio signal transformed in the microphone unit sequentially at a shorter time interval than a time period from a time point the microphone unit is turned on to a time point an output thereof grows to reach a maximum level by howling.

6. The microphone apparatus according to claim 2, wherein the switching unit switches the audio signal transformed in the microphone sequentially at a shorter time interval than a time period from a time point the microphone is turned on to a time point an output thereof grows to reach a maximum level by howling.

7. The microphone apparatus according to claim 1, wherein the microphone unit is a dynamic-type microphone unit.

8. The microphone apparatus according to claim 2, wherein the microphone is a dynamic-type microphone.

9. The microphone apparatus according to claim 7, wherein output terminals of the microphone units except for the microphone unit selected by the switching unit are short-circuited for damping.

10. The microphone apparatus according to claim 8, wherein output terminals of the microphones except for the microphone selected by the switching unit are short-circuited for damping.

11. The microphone apparatus according to claim 1, wherein the switching unit includes an analog switch.

12. The microphone apparatus according to claim 2, wherein the switching unit includes an analog switch.

13. The microphone apparatus according to claim 1, wherein, a total number of the microphone units is equal to a total number of the switching contacts of each switch of the switches.

14. The microphone apparatus according to claim 2, wherein a total number of the microphones is equal to a total number of the switching contacts of each switch of the switches.

* * * * *